(12) United States Patent
Kamata et al.

(10) Patent No.: US 7,314,833 B2
(45) Date of Patent: Jan. 1, 2008

(54) METHOD FOR MANUFACTURING SUBSTRATE FOR DISCRETE TRACK RECORDING MEDIA AND METHOD FOR MANUFACTURING DISCRETE TRACK RECORDING MEDIA

(75) Inventors: Yoshiyuki Kamata, Tokyo (JP); Katsuyuki Naito, Tokyo (JP); Akira Kikitsu, Yokohama (JP); Masatoshi Sakurai, Tokyo (JP); Masahiro Oka, Ichihara (JP)

(73) Assignees: Kabushiki Kaisha Toshiba, Tokyo (JP); Showa Denko K.K., Tokyo (JP)

( * ) Notice: Subject to any disclaimer, the term of this patent is extended or adjusted under 35 U.S.C. 154(b) by 0 days.

(21) Appl. No.: 11/476,038

(22) Filed: Jun. 28, 2006

(65) Prior Publication Data

US 2007/0001331 A1    Jan. 4, 2007

(30) Foreign Application Priority Data

Jun. 28, 2005  (JP) .............................. 2005-188387

(51) Int. Cl.
*H01L 21/302* (2006.01)
(52) U.S. Cl. ...................................... 438/706; 438/745
(58) Field of Classification Search ................ 438/706, 438/745; 216/58, 62, 83
See application file for complete search history.

(56) References Cited

U.S. PATENT DOCUMENTS

| 5,747,385 | A | | 5/1998 | Torii |
| 5,853,962 | A | * | 12/1998 | Bowers ........................ 430/331 |
| 5,908,510 | A | * | 6/1999 | McCullough et al. .......... 134/2 |
| 6,343,609 | B1 | * | 2/2002 | Kim ............................ 134/1.3 |
| 6,936,181 | B2 | * | 8/2005 | Bulthaup et al. .............. 216/44 |
| 2003/0082485 | A1 | * | 5/2003 | Bulthaup et al. ............ 430/312 |
| 2004/0209123 | A1 | * | 10/2004 | Bajorek et al. ......... 428/694 TP |
| 2005/0271819 | A1 | * | 12/2005 | Wago et al. ................. 427/259 |

FOREIGN PATENT DOCUMENTS

| JP | 3254762 B2 | 2/2002 |
| JP | 2004-079992 | 3/2004 |
| JP | 2004-349577 | 12/2004 |
| JP | 2004-356244 | 12/2004 |

* cited by examiner

*Primary Examiner*—Kin-Chan Chen
(74) *Attorney, Agent, or Firm*—Pillsbury Winthrop Shaw Pittman, LLP

(57) ABSTRACT

According to one embodiment, a method for manufacturing a substrate for a discrete track recording media, the method includes forming an imprint resist layer on a substrate, imprinting, on the imprint resist layer, a stamper formed with patterns of protrusions and recesses corresponding to recording track zones and servo zones to transfer the patterns of protrusions and recesses to the imprint resist layer, removing the stamper from the imprint resist layer, and diffusing liquefied $CO_2$ in a process chamber set at a pressure of 2 to 5 atm, diffusing liquefied $H_2O$ in the process chamber set at a pressure of 0.01 to 1 atm, or diffusing a reactive gas selected from a group consisting of liquefied $CF_4$, $CHF_3$, $SF_6$, and $C_2F_6$ in the process chamber set at an arbitrary pressure, to jet spray the liquefied gas onto a surface of the substrate.

4 Claims, 5 Drawing Sheets

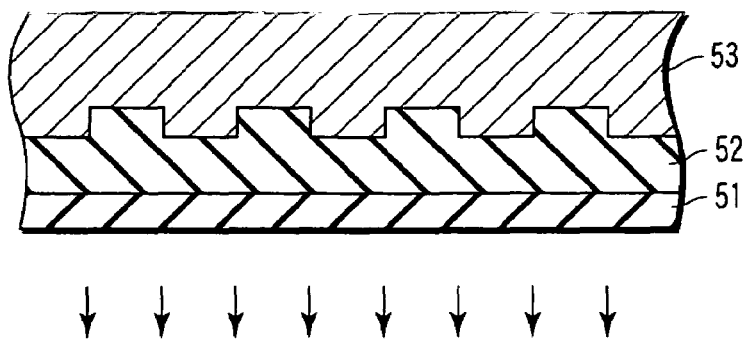
F I G. 5A
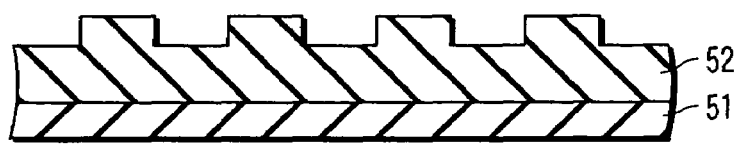
F I G. 5B
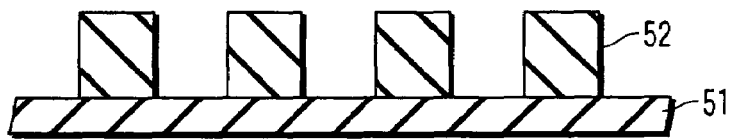
F I G. 5C
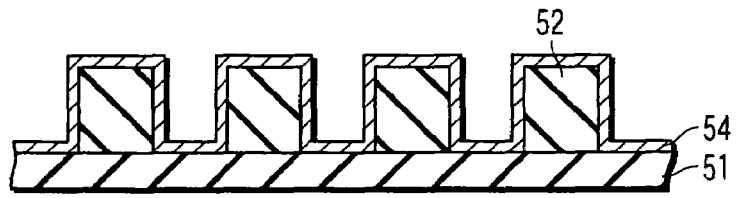
F I G. 5D
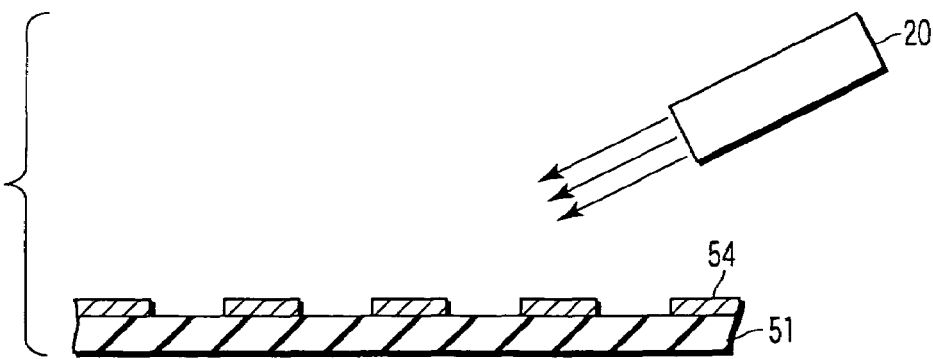
F I G. 5E

METHOD FOR MANUFACTURING SUBSTRATE FOR DISCRETE TRACK RECORDING MEDIA AND METHOD FOR MANUFACTURING DISCRETE TRACK RECORDING MEDIA

CROSS-REFERENCE TO RELATED APPLICATIONS

This application is based upon and claims the benefit of priority from Japanese Patent Application No. 2005-188387, filed Jun. 28, 2005, the entire contents of which are incorporated herein by reference.

BACKGROUND

1. Field

One embodiment of the present invention relates to a method for manufacturing a substrate for a discrete track recording media and a method for manufacturing a discrete track recording media.

2. Description of the Related Art

In improving track density of a hard disk drive (HDD), the problem of interference with adjacent tracks has become obvious. In particular, a reduction in write-blur due to a fringe effect of a write head magnetic field is an important technical problem. A discrete track recording media (DTR media) in which recording tracks are physically separated can reduce a side-erase phenomenon at the time of writing, and a side-read phenomenon that information of adjacent tracks are mixed up at the time of reading, and the like. Consequently, it is possible to greatly improve the track density, which can provide a magnetic recording media onto which high-density recording is possible.

Methods for manufacturing a DTR media mainly include a method of magnetic film etching type and a method of substrate etching type. The method for manufacturing a DTR media of magnetic film etching type involves a large number of manufacturing steps and is thus expected to increase costs. On the other hand, a method for manufacturing a DTR media of substrate etching type is suitable for mass production; the method first manufactures a substrate having protrusions and recesses and deposits a magnetic layer on the substrate by a sputtering method as is the case with the prior art. However, in a DTR media manufactured in accordance with the method of substrate etching type, the top surfaces of the protrusions are inferior in flatness. It is thus difficult to perform write and read operations using a head with low flying height. If a DTR media is directly manufactured by the method of substrate etching type including an imprinting method, burrs may be created at the edges of the protrusions. This may affect subsequent deposition of a magnetic film to preclude the tops of recording tracks from retaining flatness. If a DTR media is manufactured by the method of substrate etching type, a magnetic material deposited on a remaining resist that has failed to be removed may be peeled off, which degrades a head disk interface (HDI).

Jpn. Pat. Appln. KOKAI Publication No. 2004-79992 discloses a semiconductor manufacturing process in which contaminating particles are removed by a cryogenic cleaning process using $CO_2$ after chemical mechanical polishing (CMP) of a semiconductor material. In this method, liquid $CO_2$ is jet sprayed through a specially designed nozzle, for example, under a pressure of 850 psi (5.8 MPa) at 25° C. The liquid $CO_2$ is jet sprayed in an atmospheric pressure, and thus is rapidly expanded and evaporated into gaseous $CO_2$. Further, with lowering of temperature, part of the gaseous $CO_2$ forms carbon dioxide snow containing solid and liquid $CO_2$. The flow of the gaseous and solid $CO_2$ is directed to the wafer surface using the nozzle. Cryogenic particles that reach the wafer surface at a high speed and collide with contaminating particles can overcome adhesion of the contaminating particles to the wafer surface through transfer of momentum between the cryogenic particles and contaminating particles, and can remove the contaminating particles directly. In Jpn. Pat. Appln. KOKAI Publication No. 2004-79992, however, contaminating particles to be removed are at most 0.3 μm in size. Burrs that may result from the manufacture of a DTR media using a method of substrate etching type are much larger than those to be removed in Jpn. Pat. Appln. KOKAI Publication No. 2004-7992. Further, the burrs to be removed are composed of the same material as that of the substrate. This precludes the burrs from being removed.

U.S. Pat. No. 5,853,962 discloses a method and apparatus for removing photoresist and redeposited materials on a semiconductor using liquid carbon dioxide snow. However, an incomplete result was obtained from an attempt to remove burrs from a substrate after an imprint step using the apparatus described in U.S. Pat. No. 5,853,962. The cause is expected to be similar to that of the disadvantage of Jpn. Pat. Appln. KOKAI Publication No. 2004-79992.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIGS. 5A, 5B, 5C, 5D, and 5E are diagrams showing exemplary processes for manufacturing a DTR media if the present invention is used for liftoff.

DETAILED DESCRIPTION

Various embodiments according to the invention will be described hereinafter with reference to the accompanying drawings. In general, according to one embodiment of the present invention, there is provided a method for manufacturing a substrate for a discrete track recording media, the method comprising: forming an imprint resist layer on a substrate; imprinting, on the imprint resist layer, a stamper formed with patterns of protrusions and recesses corresponding to recording track zones and servo zones to transfer the patterns of protrusions and recesses to the imprint resist layer; removing the stamper from the imprint resist layer; and diffusing liquefied $CO_2$ in a process chamber set at a pressure of 2 to 5 atm, diffusing liquefied $H_2O$ in the process chamber set at a pressure of 0.01 to 1 atm, or diffusing a reactive gas selected from a group consisting of liquefied $CF_4$, $CHF_3$, $SF_6$, and $C_2F_6$ in the process chamber set at an arbitrary pressure, to jet spray the liquefied gas onto a surface of the substrate.

The present inventors assumed that a failure to effectively jet spray a liquid through nozzles is the cause of failure of conventional techniques to effectively remove burrs that may result from a process of manufacturing a DTR using a method of substrate etching type. The present inventors have found through their devoted studies that adjusting the pressure in a process chamber during a jet spray step enables burrs to be removed more effectively than the conventional techniques. Specifically, the present inventors have found that the liquefied gas is preferably jet sprayed onto a surface of a substrate by diffusing it in the process chamber set as follows: liquefied $CO_2$ is diffused in the process chamber set at a pressure of 2 to 5 atm, liquefied $H_2O$ is diffused in the process chamber set at a pressure of 0.01 to 1 atm, or a reactive gas selected from a group consisting of liquefied $CF_4$, $CHF_3$, $SF_6$, and $C_2F_6$ is diffused in the process chamber set at an arbitrary pressure.

FIGS. 1A, 1B, 1C, 1D, and 1E show processes for manufacturing a substrate and a DTR media which have protrusions and recesses using a method of substrate etching type according to a first embodiment of the present invention.

Figure 1A:
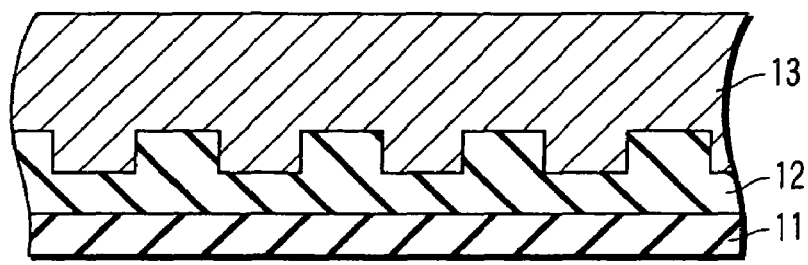
FIGS. 1A, 1B, 1C, 1D, and 1E are diagrams showing exemplary processes for manufacturing a DTR substrate and a DTR media using a method of a substrate etching type according to an embodiment of the present invention.

As shown in FIG. 1A, an imprint resist layer 12 is formed on a substrate 11. Then, a stamper, having recording tracks and servo information by forming patterns of protrusions and recesses thereon, is pressed onto the imprint resist layer 12 on the substrate 11 under a pressure of 2,000 bar for 60 minutes. The patterns are thus transferred to the imprint resist layer 12 (imprint step).

The imprint resist 12 may be spin-on-glass (SOG) that converts into $SiO_2$ when backed at high temperature, an aluminum alkoxide or aluminum oxide particulate-dispersed resist that is aluminized by exposure to oxygen or a high-temperature firing process, or a titanium oxide particulate-dispersed resist that is titanialized by exposure to oxygen or a high-temperature backing process.

Figure 1B:
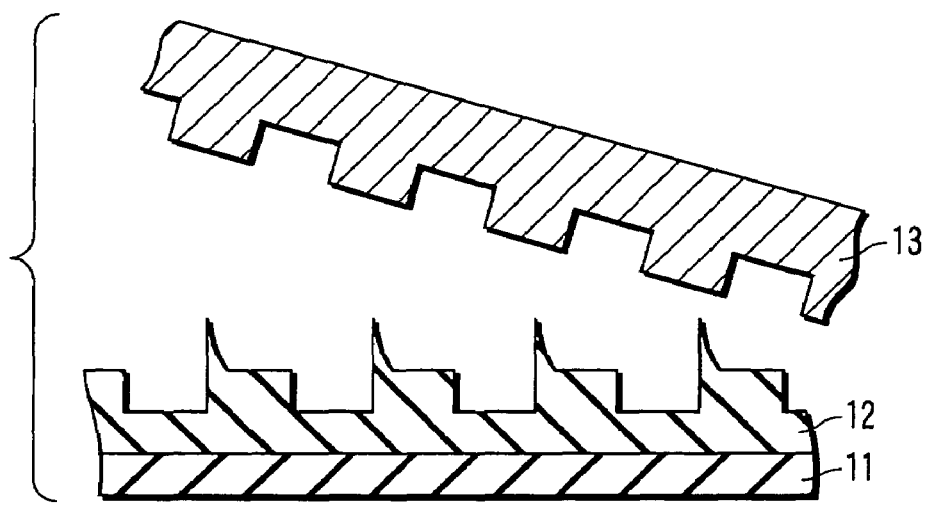

As shown in FIG. 1B, after the imprint step, the stamper 13 is removed from the imprint resist layer 12 to obtain a substrate on which the imprint resist layer 12 is formed, the imprint resist layer having the patterns of the protrusions and recesses transferred thereon. When the stamper 13 is removed, burrs may be formed on the edges of the patterns of protrusions on the imprint resist layer 12. Removing the burrs is very difficult, and incomplete removing results from the conventional techniques described in Jpn. Pat. Appln. KOKAI Publication No. 2004-79992 and U.S. Pat. No. 5,853,962.

Figure 1C:
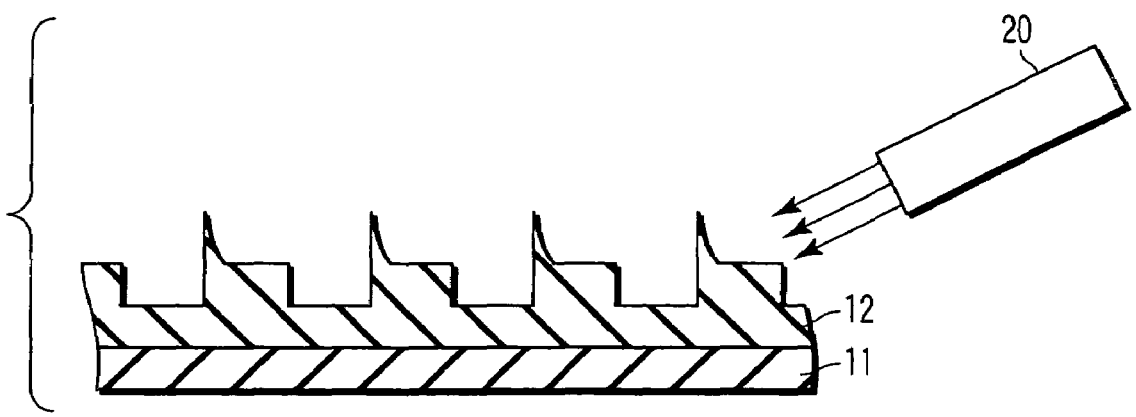

The method according to the first embodiment of the present invention removes burrs on a substrate having protrusions and recesses using a liquefied gas jet spray step of jet spraying a liquefied gas in a chamber set at a predetermined pressure as shown in FIG. 1C.

Figure 2:
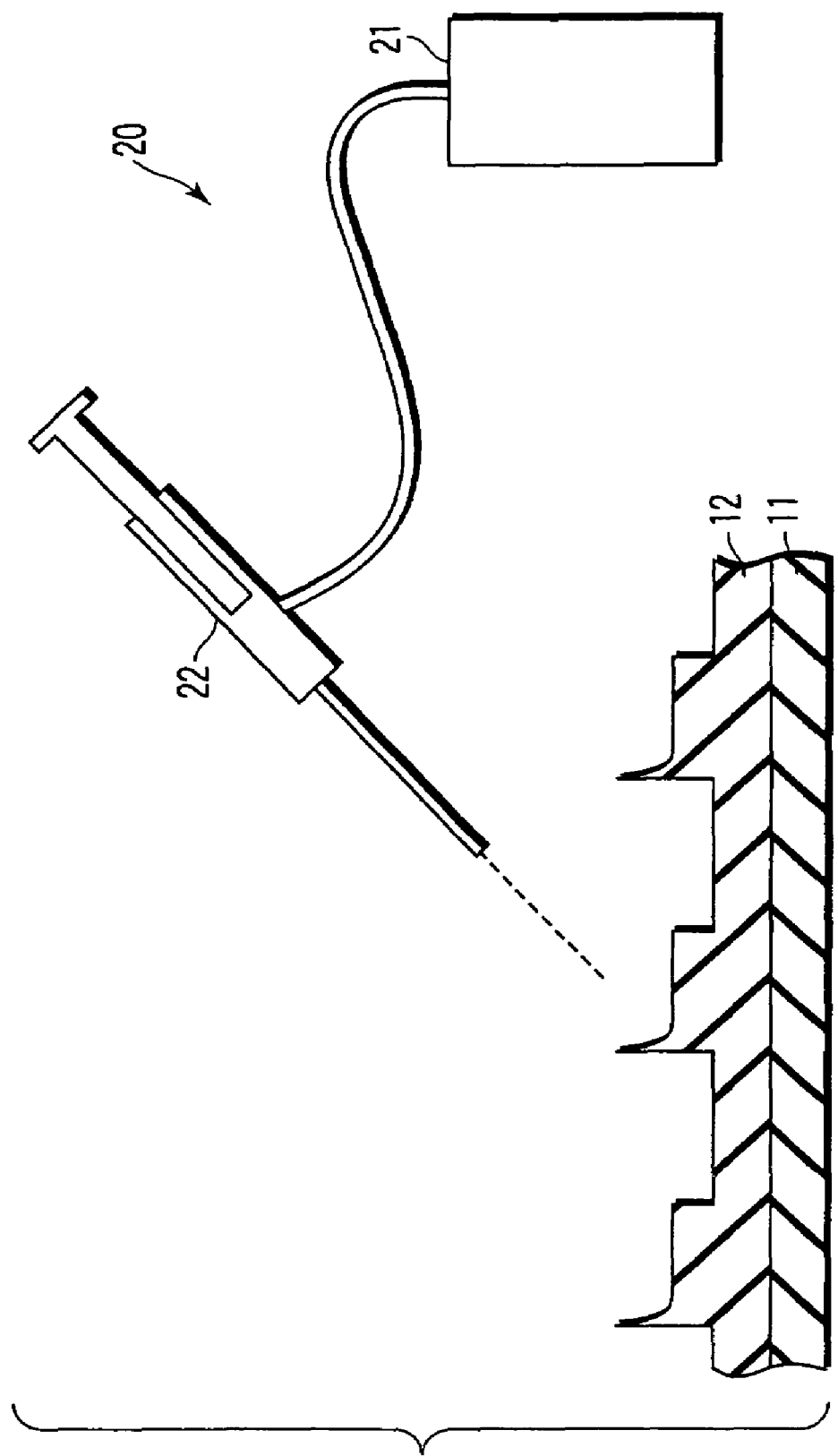
FIG. 2 is a schematic view showing a liquefied gas jet spraying step used in the present invention.

FIG. 2 is a schematic view of the liquefied gas jet spraying step according to this embodiment which is performed in FIG. 1C. A liquefied gas jet spraying apparatus 20 comprises a liquefied gas jet spraying nozzle 22 connected to a high-pressure cylinder 21. The liquefied gas jet spraying nozzle can jet spray a liquefied gas onto burrs on a substrate having protrusions and recesses at a desired pressure. When an attempt is made to remove burrs using the conventional techniques, since carbon dioxide is jet sprayed in a process chamber at the atmospheric pressure (1 atm), liquid $CO_2$ evaporates in the process chamber simultaneously with the jet spraying. This allows only gaseous $CO_2$ and solid $CO_2$ to be jet sprayed onto the burrs. The present inventors have found that setting the pressure in the chamber at a predetermined pressure, specifically at least 2 atm, enables more liquid $CO_2$ to be jet sprayed onto the burrs than the conventional techniques together with a small amount of dry ice. The present inventors have thus found that the above operation enables removing the burrs on the substrate having protrusions and recesses, which cannot be achieved by the conventional techniques.

For example, burrs on a substrate having protrusions and recesses are successfully removed by jet spraying liquid $CO_2$ with the pressure in the process chamber set between 2 and 5 atm (0.2 and 0.5 MPa). Setting the pressure in the chamber at 5 atm or higher is not preferable in terms of the safety of chamber operations.

Instead of carbon dioxide, water vapor or a reactive gas may be used as the liquefied gas. With its phase diagram taken into account, each liquefied gas is jet sprayed in the chamber set at such a pressure as allows the gas to be jet sprayed as a solid or a liquid the amount of which is larger than that in the prior art.

With, for example, water vapor, a removal effect similar to that achieved with carbon dioxide is attained by jet spraying a water vapor gas with the pressure in the process chamber reduced to 0.001 to 0.1 MPa.

When $SF_6$, a reactive gas, is jet sprayed as a liquefied gas, a burr removing effect is attained without the need to adjust the pressure in the chamber. In particular, spray jetting $SF_6$ is compatible with SOG used as an imprint resist and enabled burrs to be properly removed.

Figure 1D:
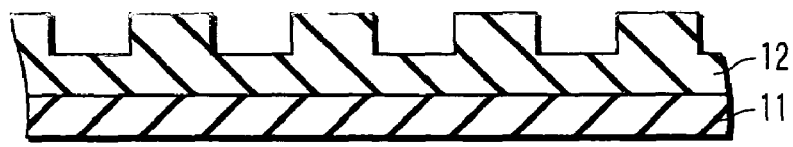

After the burrs are removed, the substrate having the protrusions and recesses from which the burrs have been removed as shown in FIG. 1D is baked at a high temperature of at least 450° C. or subjected to an oxygen exposure process to maintain a shape of the substrate having protrusions and recesses from which the burrs have been removed. If SOG is used as an imprint resist, it is converted into $SiO_2$ by the backing process. This step results in a substrate having protrusions and recesses in which top surfaces of protrusions are appropriately flat.

Figure 1E:
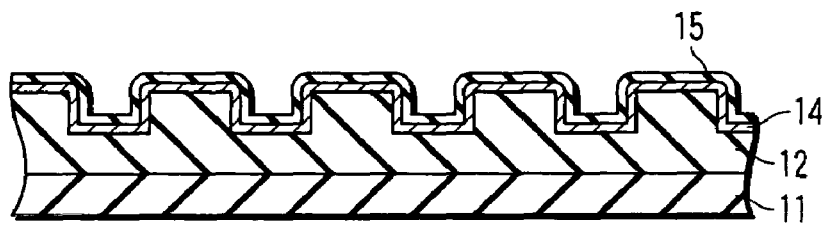

After the above process, as shown in FIG. 1E, a metal thin film 14 is deposited on the substrate having protrusions and recesses from which the burrs have been removed. The metal thin film 14 is deposited by a common deposition method for a HDD recording media (for example, a sputtering method). The metal thin film 14 may be a longitudinal or perpendicular film. The perpendicular film is preferably used as the metal thin film 14 in order to achieve high-density recording. After deposition of the metal thin film 14, a protective layer 15 may be deposited on the metal thin film 14.

For example, a DTR media with coercivity adjusted to about 4 kOe was manufactured by a method of substrate etching type in which a stack of the following was formed on the etched substrate: 60 nm of CoZrNb as a soft underlayer, 20 nm of Ru as an underlayer for controlling orientation, 20 nm of CoCrPt with the addition of a small amount of $SiO_2$ as a ferromagnetic recording layer, and 4 nm of diamond-like carbon (DLC) as a protective layer. The DTR media manufactured by the method of substrate etching type was subjected to R/W evaluations. Clear read and write signals were obtained using a read-write head of designed flying height of 12 nm. No acoustic emission (AE) signal was observed over the disk surface. This indicates that the DTR media manufactured in accordance with a method of substrate etching type according to the first embodiment of the present invention has a good HDI.

Now, with reference to FIGS. 3A, 3B, 3C, 3D, and 3E, description will be given of processes for manufacturing a DTR media using a method of substrate etching type according to a second embodiment of the present invention.

Figure 3A:
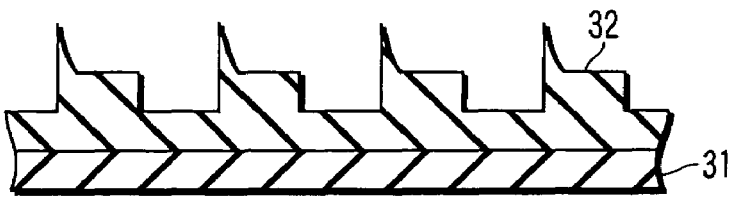
FIGS. 3A, 3B, 3C, 3D, and 3E are diagrams showing exemplary processes for manufacturing a DTR substrate and a DTR media using a method of substrate etching type according to a second embodiment of the present invention.

The method according to the second embodiment of the present invention is similar to the first embodiment in the steps performed until the stamper is removed from the imprint resist layer. FIG. 3A corresponds to the substrate in FIG. 1B.

In the method according to the second embodiment of the present invention, high-temperature backing at 450° C. or higher or a oxygen exposure process is performed without removing burrs to maintain a shape of protrusions and recesses such as the one shown in FIG. 3A. Subsequently, a metal thin film 34 is deposited on the substrate having protrusions and recesses as shown in FIG. 3B.

Figure 3B:
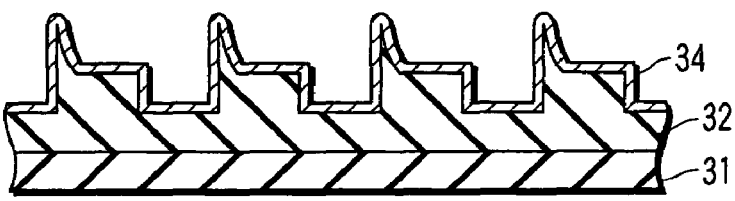
Figure 3C:
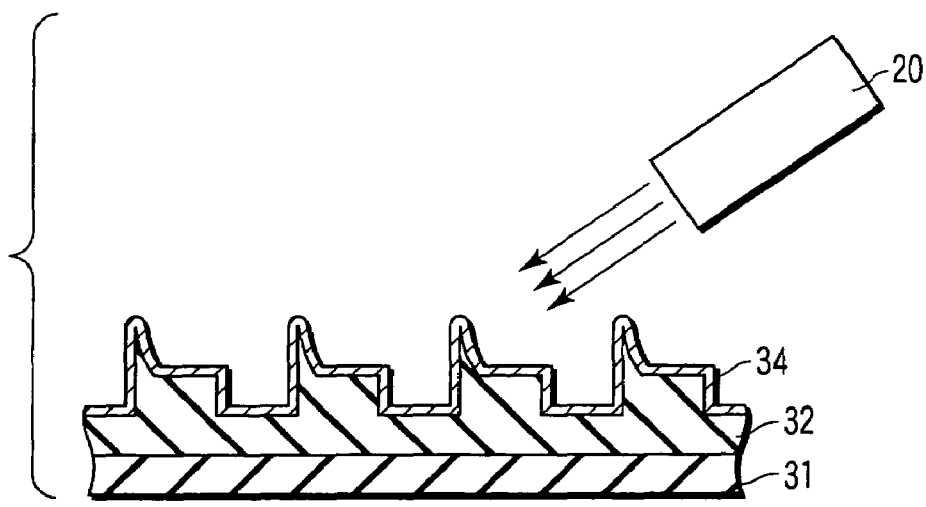

The burrs shown in FIG. 3B have their surfaces coated with the metal thin film 34. It is thus very difficult to remove the burrs using the apparatus described in U.S. Pat. No. 5,853,962. Thus, as shown in FIG. 3C, a liquefied gas jet spraying step is performed using a liquefied gas jet spraying apparatus 20 shown in FIG. 2, as is the case with the first embodiment. This enables removal of not only the burrs but also the metal thin film deposited on the burrs.

Figure 3D:
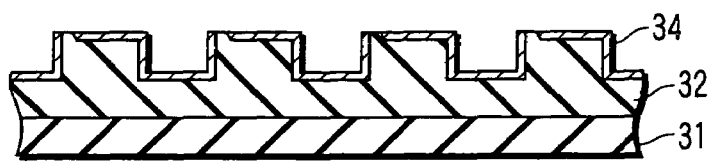
Figure 3E:
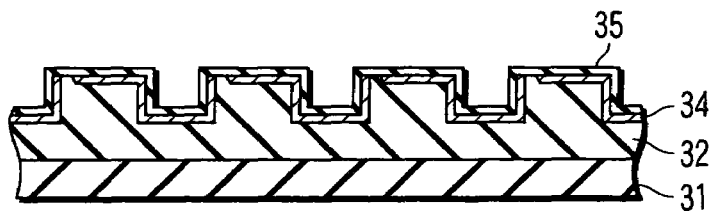

After the burrs are removed, a protective film 35 is deposited as shown in FIG. 3E. The step shown in FIG. 3E results in a magnetic recording media with appropriately flat protrusions.

For example, the protective film is formed of DLC and a lubricant is applied to the protective film. A DTR media is then manufactured in accordance with a method of substrate etching type. The DTR media manufactured in accordance with a method of substrate etching type is subjected to R/W evaluations using a read-write head with a designed flying height of 12 nm. Then, clear read and write signals are obtained. No AE signal is observed over the disk surface. This indicates that the DTR media manufactured in accordance with a manufacturing method of substrate etching type according to the second embodiment of the present invention has a good HDI.

Figure 4A:
FIGS. 4A, 4B, and 4C are diagrams showing exemplary processes for manufacturing a DTR substrate and a DTR media using a method of substrate etching type according to a third embodiment of the present invention.
Figure 4B:
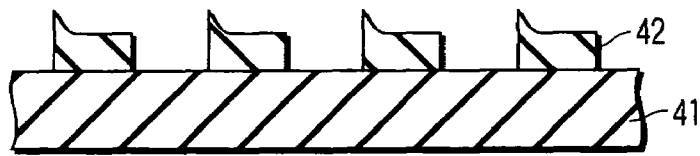
Figure 4B:
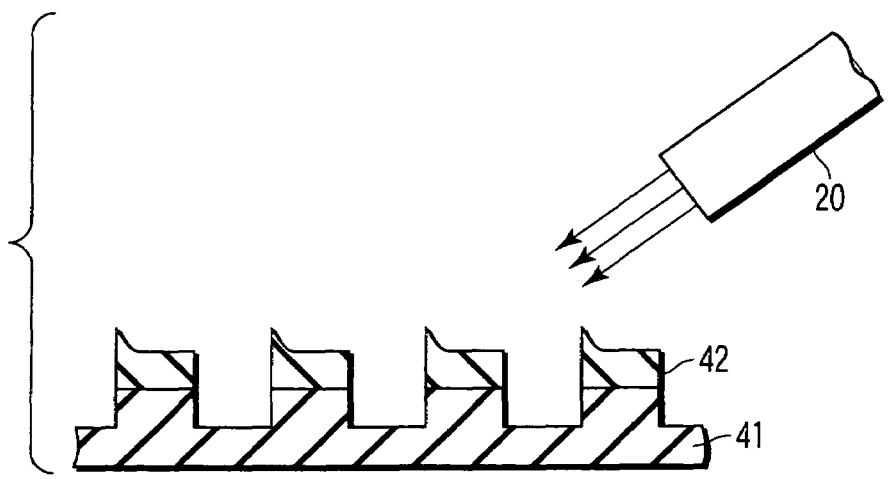
Figure 4C:

The method of the present invention can be used for a method of substrate etching type for manufacturing a substrate and a DTR media which have protrusions and recesses in which ion milling is used. With reference to FIGS. 4A, 4B, and 4C, description will be given of processes for manufacturing a substrate and a DTR media which have protrusions and recesses using a method of substrate etching type according to a third embodiment of the present invention.

The method according to the third embodiment of the present invention is similar to the first embodiment in the steps performed until the stamper is removed from the imprint resist layer. In the present embodiment, a common photo resist (for example, S1801 manufactured by Shiplay) may be used as an imprint resist. Reactive ion etching (RIE) is used to remove the resist residue in the recesses in the imprint resist layer from which the stamper has been removed.

The substrate 41 from which the resist residue has been removed is dry etched using ion beams of, for example, Ar ions, as shown in FIG. 4A. In this step, the remaining parts of the imprint resist layer 42 are not etched and remain because the resist serves as a mask. These parts become protrusions. On this occasion, the particles of the substrate material in the etched recesses adhere to the edges of the resist in a small quantity.

After the dry etching, as shown in FIG. 4B, a liquefied gas jet spraying step is performed using the liquefied gas jet spraying apparatus 20, shown in FIG. 2, as is the case with the first embodiment. On this occasion, those particles of the substrate material in the recesses which adhere to the resist edges are removed together with the burred imprint resist 42. The liquefied gas jet spraying step results in a substrate having appropriately flat protrusions as shown in FIG. 4C.

Further, a magnetic recording media in which top surfaces of protrusions are appropriately flat is obtained by performing a step of depositing a metal thin film and a protective film as is the case with FIG. 1E (this step is not shown).

The method of the present invention is also applicable to a lift off process. With reference to FIGS. 5A, 5B, 5C, 5D, and 5E, description will be given below of processes for manufacturing a DTR magnetic recording media using a method of substrate etching type involving a lift off process using the present invention.

As shown in FIG. 5A, a stamper 53 is pressed to a substrate 51 on which an imprint resist layer 52 has been formed for patterning. Patterns of protrusions and recesses are thus transferred to the substrate.

Then, as shown in FIG. 5B, RIE with oxygen is performed on the substrate from which the stamper has been removed. Remaining resist at the bottoms of the recesses of the resist is removed. In FIG. 5B, burrs may result from removing of the stamper but are not shown. RIE results in the substrate from which the remaining resist has been removed as shown in FIG. 5C.

As shown in FIG. 5D, a magnetic material 54 is deposited on the substrate obtained. The magnetic material adheres to the edges of the protrusions on the imprint resist layer shown in FIG. 5D. This precludes the imprint resist from being removed by oxygen RIE.

Thus, as shown in FIG. 5E, the substrate on which the magnetic material 54 had been deposited is subjected to a liquefied gas jet spraying step using the liquefied gas jet spraying apparatus 10, shown in FIG. 2, as is the case with the first embodiment. If SOG is used as an imprint resist, jet sprayed gas is preferably $SF_6$. This step enables the liftoff of the magnetic material adhering to the tops and edges of the imprint as well as the imprint resist. This step results in a DTR media having the zones formed of magnetic material separated from each other.

A lift off process using a conventional resist removing liquid (for example, NMP) involves dust generation attributed to a wet process and thus significantly degrades HDI. However, as described above, the method of the present invention can simultaneously remove dust and thus enables a lift off process for a DTR media which has been impossible in the prior art to be performed.

Description will be given below of materials used for the layers of magnetic recording media as well as the stack structure of each layer according to the embodiment of the present invention.

<Substrate>

Examples of a substrate include a glass substrate, an Al-based alloy substrate, a ceramic substrate, a carbon substrate, and an Si single-crystal substrate. As a glass substrate, amorphous glass or single-crystal glass can be used. Examples of amorphous glass include soda lime glass and aluminosilicate glass. Examples of crystallined glass include lithium crystallized glass. A ceramic substrate may be, for example, a sintered body consisting substantially of aluminum oxide, aluminum nitride, silicon nitride, or the like, or one obtained by fiber-reinforcing those sintered bodies. An Si single-crystal substrate, i.e., a silicon wafer may have an oxide film on the surface thereof. Further, one obtained by forming an NiP layer on the above-described metal substrate or a nonmetal substrate by plating or sputtering can be used.

<Soft Underlayer>

When a perpendicular magnetic recording medium is manufactured, that is formed as a so-called perpendicular two-layer medium having a perpendicular magnetic recording layer on a soft underlayer (SUL). The soft underlayer of the perpendicular two-layer medium is provided for allowing a writing magnetic field from a magnetic pole to pass through, and for allowing the recording magnetic field to return to a return yoke arranged in the vicinity of the magnetic pole. Namely, the soft underlayer serves as one part of functions of a write head, and functions as a part of improving a writing efficiency by applying a precipitous perpendicular magnetic field to the recording layer.

As the soft underlayer, a high permeability material including at least one of Fe, Ni and Co is used. Examples of the material include an FeCo-based alloy such as FeCo or FeCoV; an FeNi-based alloy such as FeNi, FeNiMo, FeNiCr, or FeNiSi; an FeAl-based and FeSi-based alloy such as FeAl, FeAlSi, FeAlSiCr, FeAlSiTiRu, or FeAlO; an FeTa-based alloy such as FeTa, FeTaC, or FeTaN; and an FeZr-based alloy such as FeZrN.

As the soft underlayer, a material may be used which has a microcryatalline structure such as FeAlO, FeMgO, FeTaN, or FeZrN containing 60 at % or more of Fe, or a granular structure in which fine crystal particles are dispersed in a matrix.

Examples of the material of the soft underlayer further include a Co alloy containing Co and at least one of Zr, Hf, Nb, Ta, Ti and Y. 80 at % or more of Co is preferably contained therein. When such a Co alloy is formed to be a film by sputtering, an amorphous layer is easy to form. An amorphous soft magnetic material has no crystalline magnetic anisotropy, crystalline defect, or grain boundary, and thus exhibits an extremely excellent soft magnetisation. By using an amorphous soft magnetic material, an attempt can be made to make a noise of a medium lower. Examples of a suitable amorphous soft magnetic material include CoZr-, CoZrNb-, and CoZrTa-based alloys.

Under the soft underlayer, an underlayer may be also provided in order to improve the crystallinity of the soft underlayer, or to improve the adherence of the soft under layer to the substrate. Examples of a material of the underlayer include Ti, Ta, W, Cr and Pt, or an alloy containing those, or an oxide or a nitride thereof.

An intermediate layer composed of a nonmagnetic material may be provided between the soft underlayer and the perpendicular magnetic recording layer. A role of the intermediate layer is to cut off exchange coupling interaction between the soft magnetic underlayer and the recording layer, and to control the crystallinity of the recording layer. Examples of a material of the intermediate layer include Ru, Pt, Pd, W, Ti, Ta, Cr, and Si, or an alloy containing those, or an oxide or a nitride thereof.

In order to prevent a spike noise, the soft underlayer may be comprising of a plurality of layers, and have a Ru film having thickness of 0.5 to 1.5 nm interposed therebetween, whereby anti-ferromagnetic coupling may be carried out. In addition, the soft magnetic layer may be exchange coupled to a hard magnetic film having in-plane anisotropy, such as CoCrPt, SmCo, or FePt, or a pinning layer composed of an antiferromagnetic material such as IrMn or PtMn. In this case, a magnetic layer, for example, Co, or a nonmagnetic layer, for example, Pt may be laminated above and under an Ru layer in order to control an exchange coupling force.

<Perpendicular Magnetic Recording Layer>

As the perpendicular magnetic recording layer, for example, a material is used which consists substantially of Co, contains at least Pt, Cr as needed, and further includes an oxide (for example, a silicon oxide, a titanium oxide). In the perpendicular magnetic recording layer, it is preferred for magnetic crystal particles to have a columnar structure. In the perpendicular magnetic recording layer having such a structure, the orientation and the crystallinity of the magnetic crystal particles are satisfactory, and as a result, a signal-to-noise ratio (SNR) suitable for high-density recording can be obtained. In order to obtain the structure described above, a quantity of oxide is important. A content of oxide is preferably 3 mol % or more and 12 mol % or less, and more preferably 5 mol % or more and 10 mol % of the total amount of Co, Pt, and Cr. When the content of oxide in the perpendicular magnetic recording layer is within the above-described range, the oxide is precipitated at the periphery of the magnetic particles, which can be isolated and become fine. When the content of oxide is over the above-described range, the oxide remains in the magnetic particles, which deteriorates the orientation and the crystallinity of the magnetic particles. Further, the oxide is precipitated above and under the magnetic particles, and as a result, preventing the formation of a columnar structure in which the magnetic particles penetrate through the perpendicular magnetic recording layer in the perpendicular direction. On the other hand, the content of oxide, which is less than the above-described range, causes the magnetic particles to be insufficiently isolated and become fine insufficiently. As a consequence, a noise at the time of reading/writing increases, and a signal-to-noise ratio (SNR) suitable for high-density recording cannot be obtained.

The content of Pt in the perpendicular magnetic recording layer is preferably 10 at % or more and 25 at % or less. When the content of Pt is within the above-described range, a uniaxial magnetic anisotropy constant Ku required for the perpendicular magnetic recording layer can be obtained, and moreover, the orientation and the crystallinity of the magnetic particles are made satisfactory. Consequently, it is possible to obtain a thermal fluctuation tolerance and a read/write property which are suitable for high-density recording. When the content of Pt is over the above-described range, a layer having a face-centered cubic (fcc) structure is formed in the magnetic particles, which could lead to deteriorations in the orientation and crystallinity. When the content of Pt is less than the above-described range, on the other hand, a thermal fluctuation tolerance cannot be obtained in accordance with a Ku suitable for high-density recording.

The content of Cr in the perpendicular magnetic recording layer is preferably 0 at % or more and 25 at % or less, and more preferably 10 at % or more and 20 at % or less. When the content of Cr is within the above-described range, high magnetisation can be maintained without decreasing a uniaxial magnetic anisotropy constant Ku. As a result, a read/write property which is suitable for high-density recording and a sufficient thermal fluctuation tolerance can be obtained. When the content of Cr is over the above-described range, a thermal fluctuation tolerance deteriorates because a Ku of the magnetic particles is made little, and the crystallinity and the orientation of the magnetic particles deteriorates. As a result, a read/write property deteriorates.

The perpendicular magnetic recording layer may include one or more additive elements selected from B, Ta, Mo, Cu, Nd, W, Nb, Sm, Tb, Ru and Re, in addition to Co, Pt, Cr and an oxide. Since these additive elements are contained, it is possible to stimulate a reduction in the size of the magnetic particles, or to improve the crystallinity and the orientation thereof, thereby enabling to obtain a read/write property and a thermal fluctuation tolerance which are more suitable for high-density recording. The total content of these addictive elements is preferably 8 at % or less. When it is over 8 at %, a phase except for a hexagonal close-packed (hcp) phase is formed in the magnetic particles, and thus, the crystallinity and the orientation of the magnetic particles are disturbed. As a consequence, it becomes impossible a read/write property and a thermal fluctuation tolerance which are suitable for high-density recording.

Examples of a material of the perpendicular magnetic recording layer further include a CoPt-based alloy, a CoCr-based alloy, a CoPtCr-based alloy, CoPtO, CoPtCrO, CoPtSi, and CoPtCrSi. The perpendicular magnetic recording layer may be a multilayer film of Co and an alloy which consists substantially of at least one type selected from the group consisting of Pt, Pd, Rh and Ru. Further, a multilayer film such as CoCr/PtCr, CoB/PdB, or CoO/RhO having Cr, B or O added may be used as the each layers of the multilayer thereof.

The thickness of the perpendicular magnetic recording layer is preferably 5 to 60 nm, and more preferably 5 to 30 nm. A perpendicular magnetic recording layer having a thickness within this range is suitable for high-density recording. When the thickness of the perpendicular magnetic recording layer is less than 5 nm, there is a tendency that a regenerative output is too low, which is lower than a noise component higher. When the thickness of the perpendicular magnetic recording layer is over 40 nm, on the other hand, there is a tendency that a readout output is too high, which distorts a waveform. A coercivity of the perpendicular magnetic recording layer is preferably 237000 A/m (3000 Oe) or more. When a coercivity is less than 237000 A/m (3000 Oe), there is a tendency that a thermal fluctuation tolerance declines. A perpendicular gradation of the perpendicular magnetic recording layer is preferably 0.8 or more. When the perpendicular gradation is less than 0.8, there is a tendency that a thermal fluctuation tolerance declines.

<Protective Layer>

The protective layer prevents corrosion of the perpendicular magnetic recording layer as well as damage of the surface of the medium when the magnetic head touches a medium. Examples of a material of the protective layer include a material containing C, $SiO_2$, and $ZrO_2$. A thickness of the protective layer is preferably made to be 1 to 10 nm. When the thickness of the protective layer is made to be within the above-described range, spacing between the head and a medium can be made less, which suitable for high-density recording.

Carbon can be classified into $sp^2$-bonded carbon (graphite) and $sp^3$-bonded carbon (diamond). The $sp^3$-bonded carbon is superior in the durability and the corrosion resistance to that of graphite. However, because the $sp^3$-bonded carbon is crystalline, the smoothness on a surface thereof is inferior to that of graphite. Usually, carbon is formed to be a film by sputtering using a graphite target. In this method, amorphous carbon in which $sp^2$-bonded carbon and $sp^3$-bonded carbon are mixed is formed. Carbon in which a ratio of $sp^3$-bonded carbon is high is called diamond-like carbon (DLC). Since the DLC is excellent in the durability and the corrosion resistance, and is excellent in the smoothness on a surface thereof as well because of amorphous, it is utilized as a surface protective film for the magnetic recording media. With respect to film formation of DLC by a chemical vapor deposition (CVD) method, DLC more rich in $sp^3$-bonded carbon can be formed by satisfying the conditions because DLC is generated by exciting and decomposing a raw gas in plasma, and due to a chemical reaction thereof.

<Lubricant Layer>

Examples of a lubricant agent include per-fluoro-polyether, alcohol fluoride, and fluorinated carboxylic acid.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for manufacturing a discrete track recording media, the method comprising:

forming an imprint resist layer on a substrate;

imprinting, on the imprint resist layer, a stamper formed with patterns of protrusions and recesses corresponding to recording track zones and servo zones to transfer the patterns of protrusions and recesses to the imprint resist layer;

removing the stamper from the imprint resist layer; and depositing a plurality of media films including a magnetic film on a surface of the subtrate, wherein after the stamper removing or the depositing, liquefied $CO_2$ is diffused in a process chamber set at a pressure of 2 to 5 atm, liquefied $H_2O$ is diffused in the process chamber set at a pressure of 0.01 to 1 atm, or a reactive gas selected from the group consisting of liquefied $CF_4$, $CHF_3$, $SF_6$, and $C_2F_6$ is diffused in the process chamber set at an arbitrary pressure, to jet spray the liquefied gas onto a surface of the imprint resist layer, and wherein, after the stamper is removed from the imprint resist layer and the plurality of media films including the magnetic film are deposited on the substrate surface, the jet spraying is performed to lift off the remaining imprint resist and the media films deposited on the remaining imprint resist.

2. The method according to claim 1, wherein the imprint resist comprises a spin-on-glass, and the spin-on-glass is baked after the jet spraying to form patterns of protrusions and recesses comprising $SiO_2$.

3. The method according to claim 1, wherein the imprint resist is selected from the group consisting of aluminum alkoxide, aluminum oxide dispersed resist, and titanium oxide dispersed resist.

4. The method according to claim 1, wherein the imprint resist comprises a photoresist.

* * * * *